Nov. 21, 1961

M. D. HOUSTON 3,009,977

THERMOELECTRIC MATERIAL AND DEVICES

Filed Aug. 14, 1959

2 Sheets-Sheet 1

WITNESSES

Robert C Baird

Charles L. Menzemer

INVENTOR

Maurice D. Houston.

BY

Frederick Shapoe

ATTORNEY

Nov. 21, 1961 M. D. HOUSTON 3,009,977

THERMOELECTRIC MATERIAL AND DEVICES

Filed Aug. 14, 1959 2 Sheets-Sheet 2

3,009,977

THERMOELECTRIC MATERIAL AND DEVICES

Maurice D. Houston, Monroeville, Pa., assignor to Westinghouse Electric Corporation, East Pittsburgh, Pa., a corporation of Pennsylvania Filed Aug. 14, 1959, Ser. No. 833,773
9 Claims. (Cl. 136—5)

The present invention relates generally to thermoelectric elements and thermoelectric devices embodying the same, and more particularly to thermoelectric elements comprised of rare earth subsulfide compounds.

It has been regarded as highly desirable to produce thermoelectric devices wherein either an electric current is passed therethrough to provide for cooling applications, or alternatively a source of heat is applied to one junction of a thermoelectric device to bring this junction to a given elevated temperature while the other junction is kept at a low temperature, whereby an electrical voltage is generated in the device. For refrigeration or heat extraction applications in particular, one junction of the thermoelectric device is disposed within an insulated chamber and electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the thermoelectric power of the thermoelectric elements employed, and to the temperature difference between the junctions. Accordingly, it is desirable that the thermoelectric elements be made of such material, all other factors being equal, that the highest potential is developed for the temperature difference between the hot and cold junctions. The electrical resistivity of the thermoelectric element member of the device and the thermal conductivity of the element both should be as low as possible in order to reduce electrical losses and thermal losses.

Thermoelectric devices may be tested and a number indicating its relative effectiveness, called the figure of merit, may be computed from the test data. The higher the figure of merit, the more efficient is the thermoelectric design. The figure of merit, denoted as Z, is defined by:

$$Z=\frac{S^2}{pK}$$

wherein $S$=Seebeck coefficient (volts/° C.)
$p$=electrical resistivity (ohm-cm.)
$K$=thermal conductivity (watts/cm. ° C.)

In some cases, another criterion often applied to describe the relative merit of a given thermoelectric material is the index of efficiency M. The higher the index of efficiency, the more efficient is the thermoelectric device in converting heat to electrical energy. The index of efficiency, denoted as M, for a thermoelectric member may be defined as follows:

$$M=\frac{TS^2}{4pK}$$

wherein T is the absolute temperature and the other symbols have the meaning set forth above.

An object of the present invention is to provide a thermoelectric power generating device in which the one element is comprised of a material having the formula $MS_{y-x}Se_x$, wherein M is an element of the lanthanum rare earth series.

Another object of the present invention is to provide a thermoelectric power generating device in which one element is comprised of a material having the formula $MS_y$.

A further object of the present invention is to provide a thermoelectric power generating device in which one element is comprised of a material having the formula $SmS_{1.0\ to\ 0.5}$.

A still further object of the present invention is to provide a process for producing a thermoelectric material comprised of a lanthanum series rare earth subsulfide comprising, admixing the rare earth metal and sulfur in a ratio such that the ratio of metal to sulfur is at least one, reacting the metal and the sulfur at an elevated temperature, cooling the reacted mass to ambient temperature, compacting the reacted material into the desired configuration, and firing the compacted material at an elevated temperature.

Other objects of the present invention will, in part, be obvious and will, in part, appear hereinafter.

For a better understanding of the nature and objects of the invention, reference should be had to the following detailed description and drawings in which.

Figure 1:
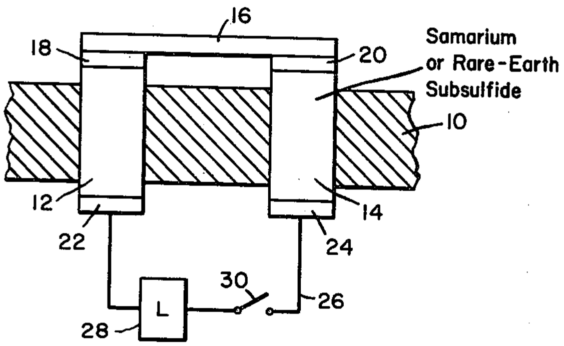
FIGURE 1 is a schematic view partly in cross section of a thermoelectric power generating device.

This invention is directed to the preparation and use of certain rare earth metal subsulfide compounds as thermoelectric element members in thermoelectric power generating and heat extraction or refrigeration devices.

In accordance with the present invention and attainment of the foregoing objects, there is provided a thermoelectric power generating device comprising at least one pair of joined members, one member of each pair comprised of a material having the formula $MS_{y-x}Se_x$, wherein M represents at least one element selected from the lanthanum rare earth series or group consisting of lanthanum, cerium, praseodymium, neodymium, samarium, europium, gadolinium, terbium, dysprosium, holmium, erbium, thulium, ytterbium, and lutecium and $y$ varies from 1.0 to 0.5, and $x$ varies from 0 to 0.2.

In accordance with the present invention there is provided a process for producing the thermoelectric material having the equation $MS_{y-x}Se_x$, comprising admixing the reactants M, S and Se in a finely divided particle form, reacting the admixed materials at an elevated temperature, cooling the reacted mass to ambient temperature, compacting the cooled reactant material to the desired configuration and thereafter firing the compact at an elevated temperature.

The most convenient and satisfactory process for preparing the material of this invention comprises admixing in finely divided particle form at least one element (M) selected from the group consisting of lanthanum, cerium, praseodymium, neodymium, samarium, europium, gadolinium, terbium, dysprosium, holmium, erbium, thulium, ytterbium, and lutecium, with the required amount of sulfur.

The element (M) should have a purity of at least 99%, and preferably 99.6% and higher and the sulfur a purity of at least 99.5% for the most satisfactory results. The nature of the impurities will determine the amounts permissible. The materials should be admixed in such proportions so that the element to sulfur ratio is at least one. Preferably the materials should be in a finely divided particle form such that all of the particles will pass through a 120 mesh (U.S. standard) sieve. If desired, a doping material, selenium, may be admixed with the element and the sulfur. The selenium should have a purity of at least 99.9%, and have a particle size such that the entire mass will pass through a 120 mesh (U.S. standard) sieve. The materials should be admixed in sufficient quantities to provide a reacted compound having the formula $MS_{y-x}Se_x$, wherein $y$ varies from 1.0 to 0.5 and $x$ varies from 0 to 0.2. The reactants are admixed to a state of good homogeneity.

The admixed reactants are then charged into a bulb or tube of an inert material, for example a Vycor or quartz tube and sealed therein under a vacuum of at least $4 \times 10^{-1}$ mm. Hg.

The reactants are then heated to a temperature within the range of 626° C. to 800° C. at a rate of up to 250° C. per hour and maintained at this elevated temperature for a period of time ranging from ten minutes to two hours.

If the metal-sulfur admixture is heated to a temperature of less than 626° little or no reaction will take place. If the materials are heated to a temperature materially in excess of 800° C. the resultant reaction product will not have the best thermoelectric properties. Very satisfactory results have been achieved when the metal-sulfur admixture, and selenium if present, have been heated to a temperature of from 630° C. to 750° C.

Care must be taken in controlling the rate at which the reactants are heated from the ambient to the desired reaction temperature. Satisfactory results have been achieved when the temperature has been elevated at a rate of from 150° C. to 250° C. per hour. A rate of less than 150° C. per hour is commercially impractical. If the temperature is elevated at a rate substantially greater than 250° C. per hour, the reaction, which is exothermic, will generate so much heat that the inert vessel may melt or be blown up. A rate of 200° C. per hour has been found quite satisfactory.

The reaction has been found to begin almost immediately upon reaching a temperature of 626°, however, the reaction should be allowed to continue for at least ten minutes to ensure completion. If allowed to react in excess of two hours the reaction products have been found to have less satisfactory thermoelectric properties.

After reacting, the subsulfide product is allowed to cool to the ambient temperature. The rate at which the reaction product is cooled is not critical and satisfatcory results have been achieved when the reaction vessel has been removed from the furnace and allowed to establish thermodynamic equilibrium with the ambient at an uncontrolled but natural rate.

The reaction product is a finely divided powder, usually a powder having a substantially black color. The powder is ground into finely divided particles such that all particles will pass through a 120 mesh (U.S. standard) sieve.

The finely divided particles of the subsulfide reaction products are then charged into a suitable mold and compacted at room temperature to the desired configuration. A pressure of from 5 to 100 tons per square inch, preferably 50 tons per square inch, has been found satisfactory. Satisfactory results have been achieved when the compaction is carried out using a tungsten carbide mold.

The compacts are then charged into a furnace and fired under a vacuum of about $4 \times 10^{-1}$ mm. Hg, at a temperature within the range of 900° C. to 1600° C. for a period of time varying from fifteen minutes to one hour. Satisfactory results have been achieved in firing the compacts at a temperature of 1200° C. for thirty minutes. The compacts have n-type thermoelectric characteristics.

The compacts thus prepared are now ready to have electrical contacts affixed thereto and to be employed as thermoelectric elements in a thermoelectric power generator. The reaction products of this invention are particularly satisfactory when operating in a temperature range of from 425° C. to 1000° C. in a protective atmosphere, for example in a vacuum or an inert atmosphere such as argon, helium or nitrogen atmosphere. In air the thermoelectric material will oxidize at high temperature and lose its thermoelectric efficiency.

Referring to FIGURE 1 of the drawing, there is illustrated a thermoelectric device suitable for producing an electrical current from a heat source. A thermally insulating wall 10 so formed as to provide suitable furnace chamber or other thermal barrier is perforated to permit passage therethrough of a positive thermoelectric member 12, and a negative thermoelectric element 14 comprised of the material of this invention and having the formula $MS_{y-x}Se_x$, in which M represents at least one element selected from the group consisting of lanthanum, cerium, praseodymium, neodymium, samarium, europium, gadolinium, terbium, dysprosium, holmium, erbium, thulium, ytterbium, and lutecium, and $y$ varies from 1.0 to 0.5, and $x$ varies from 0 to 0.2. An electrically conducting strip 16 comprised of a suitable metal, for example, copper, silver palladium or platinum or the like is joined to an end face of a member 12 and end face of the member 14 within the chamber so as to provide good electrical and thermal contact therewith. The strip 16 must be comprised of a metal that will not oxidize or melt at the hot junction temperature at which the device is operating. To provide good contacts, the end faces of the members 12 and 14 may be coated with thin layers 18 and 20, of a metal such as platinum or palladium, respectively, by vacuum evaporation or by use of ultrasonic brazing whereby good electrical contact is obtained. The metal strip 16 may be brazed or soldered to the metal layers 18 and 20. The metal strip 16 may be provided with suitable fins or other extended surface means (not shown) for conducting heat efficiently thereto from the furnace chamber or other heat source to which it is exposed.

At the end of the member 12 located on the other side of wall 10 a metal plate or strip 22 is attached by brazing or soldering in the same manner as was employed in attaching strip 16 to the other end face. Similarly, a metal strip or plate 24 may be connected to the other end of member 14. The plates 22 and 24 may be provided with heat dissipating fins or other cooling means whereby heat conducted thereto may be dissipated. The surfaces of the plates 22 and 24 may also be cooled by passing a current of fluid such as air or water across them. An electrical conductor 26 in circuit with a load 28 is electrically connected to the plates 22 and 24. A switch 30 is interposed in the conductor 26 to enable the electrical circuit to be opened and closed as desired. When switch 30 is moved to the closed position, an electrical current flows between members 12 and 14 and energizes the load 28.

It will be appreciated that a plurality of pairs of the positive and negative members may be joined in series in order to produce a plurality of cooperating thermal elements to provide a desired potential. Each of the thermal elements will be disposed with one junction in a furnace or exposed to another source of heat while the other junction is cooled by applying water or blowing air thereon or the like. Due to the relative difference in temperature of the junctions, an electrical potential will be generated in each of the thermal elements. By joining in series a suitable number of the thermal elements, direct current at any suitable voltage will be generated.

When employing the material of this invention in a thermoelectric power generating device two problems are presented; (1) pairing up the n-type subsulfide elements with p-type elements having a good figure of merit within the temperature range of the material of this invention, and (2) preventing the oxidation of the subsulfide material of this invention at temperatures approaching 1000° C.

Figure 2:
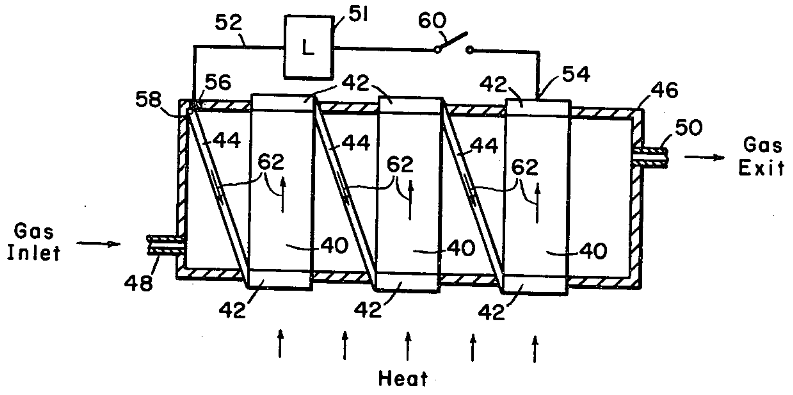
FIG. 2 is a schematic view partly in cross section of a second thermoelectric power generating device; and, FIG. 3 comprises graphs plotting the temperature against various properties of the thermoelectric material of this invention.

With reference to FIG. 2, there is illustrated a thermoelectric device designed to overcome both of the above problems. N-type thermoelectric elements, comprised of the material of this invention and having the formula $MS_{y-x}Se_x$ and having platinum or palladium electrodes 42 disposed at each end thereof, are joined or connected together in the manner illustrated by copper straps 44. The elements 40 are disposed within a chamber 46. The chamber 46 has perforations through the walls thereof to permit the passage of the contacts 42 therethrough. A gas inlet passage 48 and a gas exit passage 50 are disposed at opposite ends of the chamber 46. A load 51 is connected through a conductor 52 to one of the thermoelectric elements 40 at point 56 and the circuit is completed by passing the conductor 52 through the chamber wall 46 at a point 56 and making contact to a copper strap at point 58. A switch 60 is disposed in the circuit to control the energization of the circuit. During the operation of the thermoelectric power generator of FIG. 2, an inert gas, for example nitrogen, helium, argon or mixtures thereof and the like is passed into chamber 46 through the inlet 48 and withdrawn through the exit 50. Heat is applied to the lower side of the chamber 46, thereby heating the element ends disposed through that side of the chamber to an elevated temperature. The opposite or top ends of the thermoelectric elements 40 are cooled in any suitable manner known to those skilled in the art. As described above, the temperature difference initiates a potential difference which causes the flow of an electric current within the n-type elements 40. The direction of the current flow is indicated by the arrows 62. When the switch 60 is moved either to the open or to the closed position, an electrical current flows through the circuit and energizes the load 51, or is interrupted.

The following examples are exemplary of the teachings of this invention.

EXAMPLE I 150.35 grams of samarium metal having a purity of 99.6%, the balance being other rare earths, and 24.05 grams of sulfur having a purity of 99.9% were admixed. The samarium and sulfur were in the form of particles all of which would pass through a 120 mesh (U.S. standard) sieve. The samarium and sulfur were thoroughly admixed.

The homogeneous admixture was then charged into a Vycor tube and sealed therein under an absolute pressure of $4\times10^{-1}$ millimeters of mercury. The Vycor tube was then charged into a furnace and the samarium and sulfur heated to a temperature of 800° C. at a rate of approximately (but not exceeding) 250° C. per hour. The samarium and sulfur were maintained at a temperature of 800° C. for approximately thirty minutes during which time a chemical reaction took place. The Vycor tube with the reacted samarium sulfide ($SmS_{0.75}$) was removed from the furnace and allowed to cool to room temperature.

After reaching room temperature, the reacted samarium sulfide was removed from the Vycor tube and ground, with a mortar and pestle, to a size such that the entire mass of black powder would pass through a 120 mesh (U.S. standard) sieve.

The $SmS_{0.75}$ was then charged into a series of tungsten carbide molds and compacted with a pressure of 50 tons per square inch into a series of cylindrical pellets having a diameter ½ inch and height of ½ inch.

The pellets thus prepared were fired in a protective atmosphere at various temperatures ranging from 800° C. to 1300° C. for a period of thirty minutes.

Figure 3:
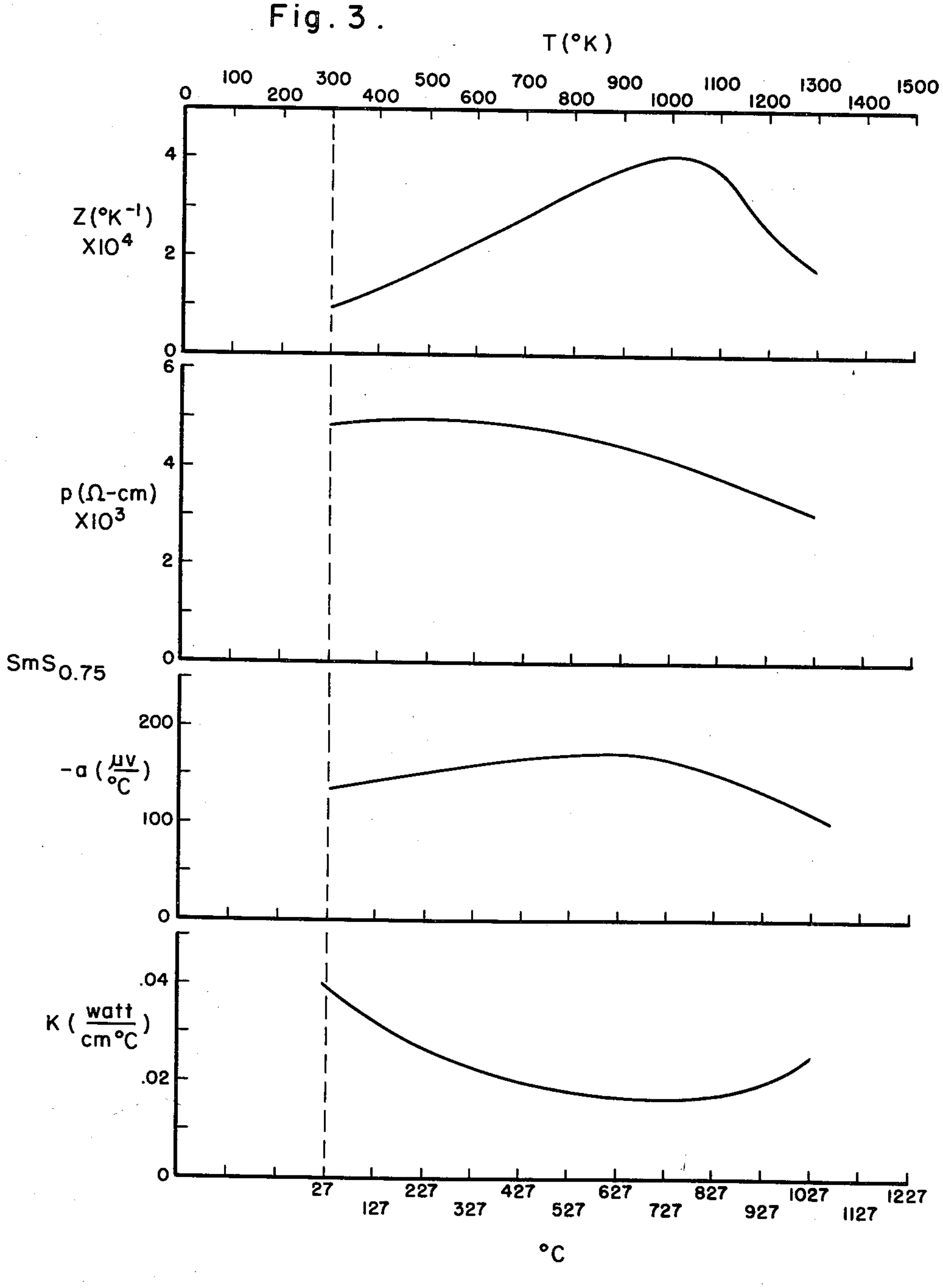

The electrical properties of the pellets fired at 1200° C. for thirty minutes were determined and are set forth graphically in FIG. 3. The thermal conductivity (K) values were calculated. From the graphical presentation of the figure of merit it can be seen that the material thus prepared had an efficiency ranging from 7½% to 10% within the temperature range of 425° C. to 1000° C. A peak efficiency of 10% was reached at a temperature of approximately 725° C.

The electrical properties of the various samples of $SmS_{0.75}$ prepared in the manner set forth above are presented in table form below.

*Table I*

ELECTRICAL AND THERMOELECTRICAL PROPERTIES OF $SmS_{0.75}$

| Firing Temperature (° C.) | Electrical Resistivity (*p*) (ohm-cm.) | Seebeck Coefficient (S) (μv./° C.) | $S^2/P$ |
|---|---|---|---|
| 800 | $3.30\times10^{-2}$ | −159 | $7.66\times10^{-7}$ |
| 1,000 | $9.76\times10^{-3}$ | −127 | $1.65\times10^{-6}$ |
| 1,100 | $6.98\times10^{-3}$ | −158 | $3.58\times10^{-6}$ |
| 1,200 | $6.83\times10^{-3}$ | −175 | $4.49\times10^{-6}$ |
| 1,300 | $1.59\times10^{-3}$ | −188 | $2.22\times10^{-6}$ |

If the thermal conductivities of the samples are considered to be the same, the quantity $S^2/P$ can be taken as a relative thermoelectric value of the material. The firing temperature is the temperature at which the compacts were fired.

EXAMPLE II

The procedure of Example I was followed using 150.35 grams of samarium and 16.03 grams of sulfur. The electrical and thermoelectric properties of the compound $SmS_{0.50}$ thus prepared are set forth in tabular form below.

*Table II*

ELECTRICAL AND THERMOELECTRICAL PROPERTIES OF $SmS_{0.50}$

| Firing Temperature (° C.) | Electrical Resistivity (*p*) (ohm-cm.) | Seebeck Coefficient (S) (μv./° C.) | $S^2/P$ |
|---|---|---|---|
| 800 | $1.10\times10^{-2}$ | −98 | $8.72\times10^{-7}$ |
| 1,000 | $5.95\times10^{-3}$ | −70 | $8.24\times10^{-7}$ |
| 1,100 | $2.41\times10^{-3}$ | −72 | $2.15\times10^{-6}$ |
| 1,200 | $2.89\times10^{-3}$ | −71 | $1.74\times10^{-6}$ |
| 1,300 | $3.17\times10^{-3}$ | −85 | $2.28\times10^{-6}$ |
| 1,400 | $6.20\times10^{-3}$ | −89 | $1.28\times10^{-6}$ |

EXAMPLE III 150.35 grams of samarium and 32.06 grams of sulfur were used in accordance with the procedure set forth in Example I to produce pellets having the formula SmS. The electrical and thermoelectrical properties of the pellets thus prepared were determined and are set forth in tabular form below.

*Table III*

ELECTRICAL AND THERMOELECTRICAL PROPERTIES OF SmS

| Firing Temperature (° C.) | Electrical Resistivity (*p*) (ohm-cm.) | Seebeck Coefficient (μv./° C.) | $S^2/P$ |
|---|---|---|---|
| 800 | $2.6\times10^{-1}$ | −238 | $2.18\times10^{-7}$ |
| 1,000 | $9.2\times10^{-2}$ | −245 | $6.53\times10^{-7}$ |
| 1,100 | $9.8\times10^{-2}$ | −347 | $1.23\times10^{-6}$ |
| 1,200 | $9.9\times10^{-2}$ | −314 | $9.96\times10^{-7}$ |
| 1,300 | $1.1\times10^{-1}$ | −337 | $1.03\times10^{-6}$ |
| 1,425 | $3.0\times10^{-2}$ | −174 | $1.01\times10^{-6}$ |
| 1,475 | $6.0\times10^{-2}$ | −204 | $6.95\times10^{-7}$ |
| 1,525 | $1.6\times10^{-1}$ | −226 | $3.19\times10^{-7}$ |
| 1,575 | $1.0\times10^{-1}$ | −275 | $7.56\times10^{-7}$ |

EXAMPLE IV 150.35 grams of samarium, 28.85 grams of sulfur and 7.89 grams of selenium were reacted in accordance with the procedure of Example I to produce the compound having the formula $SmS_{.9}Se_{.1}$. The thermoelectric properties of the material thus produced were determined and are set forth below in tabular form.

*Table IV*

| Firing Temperature (° C.) | Electrical Resistivity (p) (ohm-cm.) | Seebeck Coefficient (μv./° C.) | $S^2/P$ |
|---|---|---|---|
| 1,000 | $3.5\times10^{-2}$ | −226 | $1.5\times10^{-6}$ |
| 1,200 | $1.4\times10^{-1}$ | −387 | $1.1\times10^{-6}$ |

EXAMPLE V 138.92 grams of lanthanum and 16.03 grams of sulfur were admixed to form a homogeneous mixture. The admixture was made up of particles of lanthanum and sulfur of such a size that they would all pass through a 120 mesh (U.S. standard) sieve. The admixture was charged into a Vycor tube and sealed under a high vacuum. The tube was charged into a furnace and heated to a temperature of 750° at a rate of 150° C. per hour. The lanthanum and sulfur was maintained at the reaction temperature of 750° for one hour and then removed from the furnace and allowed to cool to room temperature.

The reaction product was then compacted into pellets one inch long and having a diameter of ½ inch under a pressure of 100 tons per square inch. The compact thus formed was fired at a temperature of 1200° C. for one hour.

The material $LaS_{0.5}$ thus prepared is suitable for use for thermoelectric purposes.

EXAMPLE VI 167.27 grams of erbium and 32.06 grams of sulfur in finely divided particle form were admixed until a homogeneous mixture was obtained. The admixture was sealed in a Vycor tube and heated to a reaction temperature of 630° at a rate of 200° C. per hour. After remaining at the reaction temperature for a period of approximately ten minutes the Vycor tube was removed from the furnace and the reaction product of the erbium and sulfur allowed to cool to room temperature. The reaction product of the erbium and sulfur had the formula ErS and was in the form of a finely divided powder.

The ErS powder was compacted into pellets having a diameter of approximately ½ inch and a length of approximately 1 inch with a pressure of 5 tons per square inch. The pellets thus formed were fired at a temperature of approximately 900° C. for twenty minutes. The compound in the pellets thus formed had the formula ErS and is suitable for thermoelectric applications.

Satisfactory results will be achieved in practicing the process set forth in Example I and substituting cerium, praseodymium, neodymium, europium, gadolinium, terbium, dysprosium, holmium, thulium, ytterbium, and lutecium for the samarium of Examples I, II and III.

EXAMPLE VII 75.17 grams of samarium, 70.07 grams of cerium and 32.06 grams of sulfur were used in accordance with the procedure set forth in Example I to produce a thermoelectric material having the formula SmCeS. The thermoelectric material thus prepared indicated it has satisfactory thermoelectric properties.

It will be understood that mixtures of two or more of the rare earths M may be combined with sulfur or sulfur and selenium as set forth herein.

While the invention has been described with reference to particular embodiments and examples, it will be understood that modifications, substitutions and the like may be made therein without departing from its scope.

I claim as my invention:

1. In a thermoelectric power generating device at least one pair of joined members, one being a member comprised of a material having the formula $MS_{y-x}Se_x$, wherein M represents at least one element selected from the group consisting of lanthanum, cerium, praseodymium, neodymium, samarium, europium, gadolinium, terbium, dysprosium, holmium, erbium, thulium, ytterbium, and lutecium, $y$ varies from 1.0 to 0.5 and $x$ varies from 0 to 0.2, and another suitable member electrically connected to one portion of said one member.

2. In a thermoelectric power generating device at least one pair of joined members, one being a member comprised of a material having the formula $MS_y$, wherein M represents at least one element selected from the group consisting of lanthanum, cerium, praseodymium, neodymium, samarium, europium, gadolinium, terbium, dysprosium, holmium, erbium, thulium, ytterbium, and lutecium and $y$ varies from 1 to 0.5, and another suitable member electrically connected to one portion of said one member.

3. In a thermoelectric power generating device at least one pair of joined members, one member comprised of a material having the formula $SmS_{y-x}Se_x$, wherein $y$ varies from 1 to 0.5 and $x$ varies from 0 to 0.2, and the other member of the pair electrically connected to one portion of said one member.

4. In a thermoelectric power generating device at least one pair of joined members, one member comprised of a material having the formula $SmS_{1\text{ to }0.5}$ and the other member of the pair electrically connected to one portion of said one member.

5. In a thermoelectric power generating device at least one pair of joined members, one member comprised of a material having the formula $SmS_{0.75}$ and the other member of the pair electrically connected to one portion of said one member.

6. A process for preparing a thermoelectric material having a formula $MS_{y-x}Se_x$, wherein M is at least one metal selected from the group consisting of lanthanum, cerium, praseodymium, neodymium, samarium, europium, gadolinium, terbium, dysprosium, holmium, erbium, thulium, ytterbium, and lutecium and $y$ varies from 1 to 0.5 and $x$ varies from 0 to 0.2, comprising (1) admixing predetermined quantities of sulfur with at least one of the aforesaid metals and from 0 to 20 mol percent selenium in finely divided particle form, (2) heating said material in a vacuum at a rate up to 250° C. per hour to an elevated reaction temperature in excess of 625° C., (3) maintaining said elevated reaction temperature for at least ten minutes, (4) cooling the reacted material to room temperature.

7. A process for preparing a thermoelectric material having the formula $MS_{y-x}Se_x$, wherein M is at least one metal selected from the group consisting of lanthanum, cerium, praseodymium, neodymium, samarium, europium, gadolinium, terbium, dysprosium, holmium, erbium, thulium, ytterbium, and lutecium and $y$ varies from 1 to 0.5 and $x$ varies from 0 to 0.2, comprising (1) admixing predetermined quantities of sulfur with at least one of the aforesaid metals and from 0 to 20 mol percent selenium in finely divided particle form, (2) heating said material in a vacuum at a rate of from 150° C. to 250° C. per hour to a temperature within the range of 625° C. to 800° C., (3) maintaining said elevated temperature for a period of time ranging from ten minutes to two hours, and (4) cooling the reacted material to room temperature.

8. A process for preparing a pellet of a thermoelectric material having a formula $MS_{y-x}Se_x$, wherein M is at least one metal selected from the group consisting of lanthanum, cerium, praseodymium, neodymium, samarium, europium, gadolinium, terbium, dysprosium, holmium, erbium, thulium, ytterbium, and lutecium and $y$ equals 1 to 0.5 and $x$ varies from 0 to 0.2, comprising (1) admixing predetermined quantities of sulfur with at least one of the aforesaid metals and from 0 to 20 mol percent selenium in finely divided particle form, (2) heating said material in a vacuum at a rate of up to 250° C. per hour to an elevated reaction temperature in excess of 625° C., (3) maintaining said elevated temperature for at least ten minutes, (4) cooling the reacted material to room temperature, (5) compacting said reacted material into a compact with a pressure within the range of from 5 to 100 tons per square inch, and (6) firing in a vacuum at a temperature of from 900° C. to 1600° C. for from one-quarter hour to one hour.

9. A process for preparing a pellet of a thermoelectric material having a formula $MS_{y-x}Se_x$, wherein M is at least one metal selected from the group consisting of lanthanum, cerium, praseodymium, neodymium, samarium, europium, gadolinium, terbium, dysprosium, holmium, erbium, thulium, ytterbium, and lutecium, $y$ equals 1 to 0.5 and $x$ equals 0 to 0.2, comprising (1) admixing predetermined quantities of sulfur with at least one of the aforesaid metals and from 0 to 20 mol percent selenium in finely divided particle form, (2) heating said material in a vacuum at a rate within the range of from 150° C. to 250° C. per hour to an elevated reaction temperature within the range of 625° C. to 800° C., (3) maintaining said elevated temperature for a period of time within the range of from ten minutes to two hours, (4) cooling the reacted material to room temperature, (5) compacting said reacted material into a compact with a pressure of from 5 to 100 tons per square inch, and (6) firing in a protective atmosphere at a temperature of from 900° C. to 1600° C. for a period of time ranging from one-quarter hour to one hour.

References Cited in the file of this patent

UNITED STATES PATENTS

| | | |
|---|---|---|
| 685,471 | Hermite et al. | Oct. 29, 1901 |
| 1,613,877 | Dyckerhoff | Jan. 11, 1927 |
| 2,811,570 | Karrer | Oct. 29, 1957 |